(12) United States Patent
Moran et al.

(10) Patent No.: US 8,642,908 B2
(45) Date of Patent: Feb. 4, 2014

(54) ELECTRONIC DEVICE HAVING A HIDDEN INPUT KEY AND METHOD OF MANUFACTURING AN ELECTRONIC DEVICE

(75) Inventors: Jonas Moran, Torna Hallestad (SE); Mats Kleverman, Helsingborg (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 224 days.

(21) Appl. No.: 13/202,176

(22) PCT Filed: Oct. 13, 2010

(86) PCT No.: PCT/EP2010/006270
§ 371 (c)(1),
(2), (4) Date: Aug. 18, 2011

(87) PCT Pub. No.: WO2012/048718
PCT Pub. Date: Apr. 19, 2012

(65) Prior Publication Data
US 2012/0092816 A1    Apr. 19, 2012

(51) Int. Cl.
*H03K 17/975*   (2006.01)

(52) U.S. Cl.
USPC ........................................................ 200/600

(58) Field of Classification Search
USPC ....... 200/600, 5 R, 5 A, 19.06, 262, 268, 279, 200/294, 308
See application file for complete search history.

(56) References Cited

U.S. PATENT DOCUMENTS

| | | | |
|---|---|---|---|
| 3,697,787 A | | 10/1972 | Posner |
| 5,409,239 A | | 4/1995 | Tremmel |
| 5,632,679 A | * | 5/1997 | Tremmel ........................ 463/36 |
| 6,955,603 B2 | * | 10/2005 | Jeffway et al. .................. 463/36 |
| 2008/0142352 A1 | * | 6/2008 | Wright ........................... 200/600 |
| 2010/0103116 A1 | | 4/2010 | Leung et al. |

FOREIGN PATENT DOCUMENTS

| | | |
|---|---|---|
| DE | 24 13 999 A1 | 9/1975 |
| WO | 2004077388 | 9/2004 |
| WO | 2007142909 | 12/2007 |
| WO | 2010018004 | 2/2010 |

OTHER PUBLICATIONS

International Search Report, corresponding to PCT/EP2010/006270, mailed on Jun. 7, 2011.
Written Opinion of the International Searching Authority, corresponding to PCT/EP2010/006270, mailed on Jun. 7, 2011.
International Preliminary Report On Patentability, corresponding to PCT/EP2010/006270, date of mailing Apr. 25, 2013.

* cited by examiner

*Primary Examiner* — Edwin A. Leon
*Assistant Examiner* — Anthony R. Jimenez
(74) *Attorney, Agent, or Firm* — Renner, Otto, Boisselle & Sklar, LLP.

(57) ABSTRACT

An electronic device comprises a housing having an outer face and an inner face. A key is provided on the housing, which comprises a micro hole formed in the housing and a conductive material extending within the micro hole to the outer face of the housing. A sensor is coupled to the conductive material to detect whether an object is brought into contact or out of contact with the micro hole at the outer face.

15 Claims, 6 Drawing Sheets

ELECTRONIC DEVICE HAVING A HIDDEN INPUT KEY AND METHOD OF MANUFACTURING AN ELECTRONIC DEVICE

The invention relates to an electronic device and a method of manufacturing the same. The invention relates in particular to such a device having an input key to allow a user to input data or to control operation of the electronic device.

BACKGROUND OF THE INVENTION

Electronic devices, such as portable electronic devices, frequently comprise a user interface that allows a user to enter control commands or other data. Many conventional user interfaces which have been used for several decades involve hardware keys which include mechanically moveable elements. With a view to device aesthetics, there have been attempts to change the construction of electronic devices, and in particular of portable electronic devices, so as to reduce the number of mechanically moveable elements which are provided on the electronic device. One route which has been pursued has been to utilize touch sensitive screens. Such touch sensitive screens may traditionally be based on resistive or capacitive sensing techniques. In order to address some of the drawbacks associated with touch-sensitive displays, there have been proposals to use proximity sensors which do not require a user to physically touch the display. One example for such a proximity sensor is described in WO 2010/069410 A1.

Even portable electronic devices which now widely use a touch-sensitive or proximity sensing display as one input device frequently have one or several input keys separate from the display, for purposes such as switching on or off the device, menu control functions, loudspeaker volume control functions, scrolling functions, or similar. Today, such keys may still frequently be implemented using mechanically moveable elements. Besides the obvious aesthetic drawbacks of having such keys in an otherwise seamless design, mechanical input elements may be prone to wearing out over time and/or the mechanical input elements may be subject to the risk of being ruined by dirt or moisture entering the rather large openings in the device housing. Such large openings are necessary to accommodate the traditional elements of mechanical keys.

While it is conceivable to utilize input keys which can be seamlessly integrated into device housing by sensing depression of a part of the device housing, for example using capacitance sensing, there are some limitations associated with such a design. For illustration, there may be limitations with regard to positioning a key which requires a portion of the device housing to be depressed. More specifically, it may be difficult to position such a key close to a corner or edge of the device housing, because the corner or edge may provide the device surface with enhanced stiffness. Reliable detection of key actuation may then become a considerable challenge.

SUMMARY OF THE INVENTION

Accordingly, there is a continued need in the art for a portable electronic device and method of producing the same which address some of the above drawbacks. In particular, there is a continued need in the art for a portable electronic device which obviates the need to provide a large cutout in the device housing for receiving a mechanically moveable element to implement an input key. There is also a continued need in the art for a portable electronic device which allows a key to be integrated into the device housing in a seamless manner. There is also a need in the art for a method of producing such a portable electronic device.

According to an aspect, an electronic device is provided. The electronic device comprises a housing having an outer face and an inner face, a key which is provided on the housing, and a sensor. The key comprises a micro hole formed in the housing so as to extend from the inner face to the outer face, and a conductive material which extends within the micro hole to the outer face of the housing. The sensor is coupled to the conductive material and is configured to monitor an electrical characteristic to detect whether an object is brought into contact or out of contact with the micro hole at the outer face of the housing.

In the electronic device, contact of an object, such as a user's skin, with the housing may be sensed via the conductive material extending through the micro hole. Thereby, engagement or disengagement between the user's skin and a portion of the outer face in which the key is formed may be sensed without requiring mechanically moveable components to implement the key. The micro hole may be dimensioned such that it is difficult to detect, or cannot be detected at all, by an unaided human eye of an adult human having average sight.

The electronic device may be a portable electronic device.

The conductive material may be exposed on the outer face of the housing. The sensor may be configured to detect whether an object is brought into contact or out of contact with the conductive material at the outer face of the housing.

The micro hole may extend from the inner face to the outer face through a wall of the housing.

The wall may define a normal direction perpendicular to a face of the wall, and the micro hole may have a centre axis disposed at an angle relative to the normal direction. When one key is implemented using several micro holes in which there is respectively provided a conductive material extending to the outer face of the housing, at least one of the micro holes may have a centre axis disposed at an angle relative to the normal direction. Different micro holes may have centre axes which are disposed at an angle relative to each other.

The housing may be formed from a metal material.

When the housing is formed from a metal material, the sensor may be electrically coupled to the housing. The housing may serve as one of a cathode or anode for a resistance measurement performed by the sensor to measure a resistance between the housing and the conductive material extending within the micro hole(s).

The metal material may be oxidized at a boundary of the micro hole to form an insulating metal oxide layer interfacing with the conductive material. Thereby, the conductive material extending within the hole may be electrically insulated from the metal material.

The key may further comprise an insulating layer interposed between the conductive material and a boundary of the micro hole to electrically insulate the conductive material from the housing.

The insulating layer may be translucent. This allows the key to be made visible by coupling light into the translucent insulating layer.

The portable electronic device may further comprise a light source disposed within the housing and configured to couple light into the insulating layer. The light source may be coupled to a controller which selectively activates the light source to make the key visible in a selective manner.

An end of the conductive material may be flush with the outer face of the housing. This reduces the tactile response of the key upon contact with a user's skin. Alternatively, an end of the conductive material may also protrude from the outer face.

The key may be configured such that it includes a plurality of micro holes in which a conductive material is respectively arranged so as to extend from the inner face to the outer face of a wall of the housing. The plurality of micro holes associated with a key may be arranged in an array. The plurality of micro holes having a conductive material extending therein may be configured in an identical manner, but may have different orientations of their centre axes. Thereby, the active area in which a user can actuate the key by bringing his/her finger into contact with the outer face of the housing may be enlarged to a desired size. Further, the change in the electrical characteristic, such as resistance or capacitance, occurring upon engagement and disengagement of the user's skin with the outer face of the housing may be increased.

When the key includes a plurality of micro holes respectively having a conductive material disposed therein, at least a sub-set of micro holes may further include a translucent insulating material arranged therein. The key may be configured such that at least another sub-set of micro holes does not include a translucent insulating material. The arrangement of micro holes including a translucent insulating material may be selected such that a desired marking is made visible on the outer face of the housing when a light source irradiates the plurality of micro holes from within the housing.

The key may further comprise a plurality of illumination micro holes extending from the inner face to the outer face through the housing.

The electronic device may further comprise a light source disposed within the housing and configured to couple light into the plurality of illumination micro holes.

The sensor may be a resistance sensor. The resistance sensor may be electrically coupled to detect a change in resistance measured between the conductive material in a micro hole and the conductive material in another micro hole. Alternatively, the resistance sensor may be electrically coupled to detect a change in resistance measured between the conductive material in a micro hole and the housing of the electronic device.

The sensor may be a capacitance sensor.

The micro hole(s) of the key may define a micro opening in the outer face of the housing. The micro opening may have a diameter which is comparable to or smaller than resolvable by an unaided human eye.

According to another aspect, a method of manufacturing an electronic device which has a hidden key is provided. The electronic device comprises a housing having an inner face and an outer face. A micro hole is machined into the housing such that the micro hole extends from the inner face to the outer face through a wall of the housing. An electrically insulating layer is formed at a boundary of the micro hole. A conductive material is arranged in the micro hole so that the conductive material extends within the micro hole to the outer face of the housing.

The micro hole may be formed by laser-drilling.

The insulating layer may be formed by depositing an insulating material onto the inner micro hole boundary. If the housing is formed from a metal which is selected such that the native metal oxide is insulating, the insulating layer may be formed by locally oxidizing the housing at the micro hole boundary.

The method may be used to manufacture an electronic device according to any one aspect or embodiment.

It is to be understood that the features mentioned above and features yet to be explained below can be used not only in the respective combinations indicated, but also in other combinations or in isolation, without departing from the scope of the present invention. Features of the above-mentioned aspects and embodiments may be combined in other embodiments.

BRIEF DESCRIPTION OF THE DRAWINGS

The foregoing and additional features and advantages of the invention will become apparent from the following detailed description when read in conjunction with the accompanying drawings, in which like reference numerals refer to like elements.

DETAILED DESCRIPTION OF EMBODIMENTS OF THE INVENTION

Figure 1:
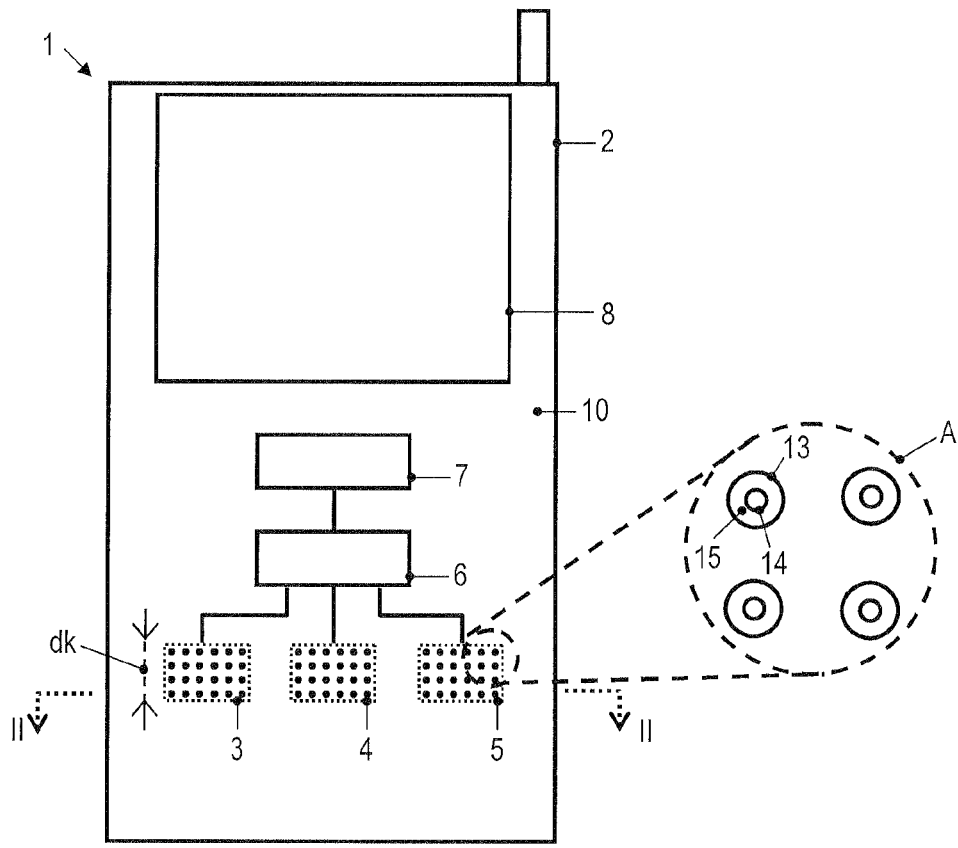
FIG. 1 is a schematic representation of a portable electronic apparatus according to an embodiment.

In the following, embodiments of the present invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only. Rather, the scope of the invention is intended to be defined only by the appended claims and equivalents thereof.

It is to be understood that the drawings are to be regarded as being schematic representations only, and elements illustrated in the drawings are not necessarily shown to scale. Rather, the various elements are represented such that their function and general purpose become apparent to a person skilled in the art.

It is also to be understood that, in the following description of exemplary embodiments, any direct connection or coupling between functional blocks, devices, components or other physical or functional units shown in the drawings or described herein may also be implemented by an indirect connection or coupling. Functional block may be implemented in hardware, firmware, software or a combination thereof.

Further, it is to be understood that the features of the various exemplary embodiments described herein may be combined with each other, unless specifically noted otherwise.

Electronic devices having a key will be described. The key comprises at least one micro hole extending to an outer face of a housing of the device, with a conductive element disposed within the micro hole also extending to the outer face of the housing.

As used in the context of embodiments, the term 'key' generally includes an input element which can be actuated by a user. Examples for such keys include power keys for switching on and off the device, menu keys for inputting an operation setting or for adjusting such a setting, navigation keys for navigating through a menu or various menu options, and alphanumerical keys for inputting a numerical or letter symbol. As used in the context of embodiments, the term 'micro hole' generally refers to holes which have lateral dimensions which are much smaller than the lateral dimensions of the key formed thereby, and which may be formed by using techniques such as laser drilling. In particular, a 'micro hole' may have a diameter which is on the order of, or smaller than, the spatial resolution attainable by an unaided human eye of an adult human. As used in the context of several embodiments, the term 'hidden key' refers to a key which is configured such that, at least in one operation state of the electronic device, it cannot be easily detected by an unaided human eye of an adult human. This does not preclude that the device includes features which allow the key to be made visible to a human operator when desired.

FIG. 1 is a schematic block diagram representation of a portable electronic device 1 according to an embodiment. The device 1 includes plural keys which are respectively configured as hidden keys. The portable electronic device 1 comprises a housing 2. The housing 2 may be formed from a metal material, e.g., from aluminum. The housing 2 may extend at least across two opposing major sides of the device 1 in a seamless manner. In an embodiment, a side of the housing in which the display 8 is provided may not define any cutouts for receiving mechanically moveable elements, such as buttons or sliders. On one of the major sides of the device 1, which is shown in FIG. 1, the display 8 may be provided, with the housing 2 seamlessly covering this side externally of the display 8.

The device 1 has an arrangement of keys 3-5. These keys are configured as hidden keys and are respectively formed with a plurality of micro holes extending through a wall 10 of the device housing 2. For each one of the keys 3-5, the plurality of micro holes includes several micro holes in which a conductive material is disposed such that the conductive material extends up to an outer face of the wall 10 of the device housing 2. The portable electronic device 1 further includes a sensor 6 which is electrically coupled to the conductive material disposed within the micro holes. The sensor 6 may, for example, be configured as a resistance sensor, as a capacitance sensor, or as another sensor which is responsive to a change in an electrical characteristic when the conductive material disposed within the micro holes is engaged with or disengaged from a user's skin.

The portable electronic device 1 further has one processor 7 or several processors 7, which are coupled to the sensor 6. The processor 7 may be configured to control operation of the device 1 based on whether a user's skin is brought into contact or out of contact with one of the key areas 3-5 on the outer face of the device housing 2. For illustration, for keys 3-5 configured as alphanumerical input keys, the processor 7 may control a display 8 such that an alphanumerical character input via the keys 3-5 is displayed. For further illustration, if one of the keys 3-5 is a power key for switching on and off the device 1, the processor 7 may activate or deactivate a fully operative state of the device 1 based on whether a user brings his finger into contact with this key.

The sensor 6 and/or the processor 7 may be configured to discriminate situations in which the user accidentally brings his/her finger into contact with one of the key areas for a short period of time from situations which are identified to represent an intentional key actuation. For illustration, the sensor 6 and/or the processor 7 may monitor the amount of change in an electrical characteristic and/or the time over which a change exceeding a pre-determined threshold is observed to make a decision on whether the monitored change in electrical characteristic represents an accidental key input action which is to be discarded or an intentional key input action which is to be processed further by the processor 7.

While not illustrated in the schematic view of FIG. 1, the portable electronic device may include additional components, such as components for wireless communication, memories, etc. Further, while three keys respectively formed with an array of micro holes are shown in FIG. 1, the device may include any number of keys configured as hidden keys respectively formed with an array of micro holes. Examples for electronic devices in which embodiments of the invention may be implemented include mobile phones, cordless phones, personal digital assistants (PDAs), cameras, portable music players and similar, without being limited thereto.

Referring to inset A of FIG. 1 and to FIGS. 2-12, implementations of hidden keys formed with micro holes will be explained in more detail.

The inset A in FIG. 1 shows a plan view of the key 5. The other keys 3 and 4 may be configured in a corresponding manner. The key 5 includes a plurality of micro holes 13 which are formed in the wall 10 of the device housing 2. In the embodiment illustrated in FIG. 1, the wall 10 defines the side of the device 1 on which the display 8 is provided. However, hidden keys formed with micro holes may also be provided at other positions on the device housing 2, e.g., on a side wall or on the wall of the housing opposite to the wall which receives the display 8.

Within the micro holes, a conductive material 14 is arranged. The conductive material 14 may, for example, be a thin metal wire inserted into the micro hole or a conductive trace deposited within the micro hole by known techniques. Further, in the illustrated configuration, an insulating material 15 is deposited in the micro hole so as to be interposed between the conductive material 14 and the hole/housing interface. When the housing 2 is not formed from an electrically conducting material, the insulating material 15 may be omitted. Further, when the device housing 2 is made from a metal material, the metal may be oxidized at the inner boundary of the micro hole 13 to form an insulating metal oxide layer. In this case, the insulating material 15 may still be provided, but may also be omitted.

The micro holes 13, in which the conductive material 14 extends to the outer face of the wall 10, have a maximum diameter which is much smaller than a characteristic dimension dk of the key area. As illustrated in FIG. 1, the characteristic dimension dk of the key area may be defined to be the minimum lateral dimension of an outer envelope of the area in which the micro holes forming the key are arranged.

In embodiments, the micro holes 13, in which the conductive material 14 extends to the outer face of the wall 10, may respectively have a diameter at the outer face of the housing which is on the order of, or smaller than, resolvable by an unaided human eye. For illustration, the limit of resolution for the human eye is about 0.1 mm at a distance from the eye of 1 meter for an adult human. In children, the resolution might be somewhat finer, for example, 0.04 mm. Thus, depending upon the anticipated viewer and viewing distance, the micro holes 13 may be selected to have a diameter on the order of, or below, the limit of resolution of the human eye. As defined herein, the micro holes 13 may constitute a 'hidden key' if the micro holes 13 respectively have a dimension, at the outer face of the device housing, which is on the order of, or are smaller than, resolvable by an unaided human eye. In an embodiment, the diameter of micro holes forming a hidden key can be smaller than 0.2 mm (200 µm) and in particular smaller than 0.1 mm (100 µm). In an embodiment, the diameter of all micro holes forming a hidden key may be smaller than 80 µm. In an embodiment, the diameter of all micro holes forming a hidden key may be in the range from 20 µm to 80 µm, inclusive. Such micro holes may be formed using micromachining techniques known to the skilled person, such as laser drilling. Using laser drilling, micro holes may be formed in metal layers.

In embodiments, for at least a sub-set of the micro holes forming the key, the insulating material 14 may be translucent. This allows the key to be made visible by activation of a light source disposed internally of the housing. It will be appreciated that even for micro holes dimensioned so as to be hidden from the unaided human eye, the light output from micro openings having a diameter of 0.1 mm or less will still be visible to the human observer. This will provide the effect of an optical signal appearing on a device surface which, in a state in which the light source is not activated, is perceived to be an essentially solid plane formed, e.g., from metal. In embodiments, for at least another sub-set of the micro holes, the micro holes may be configured such that no light can be passed therethrough from the interior of the housing to the outer face of the housing wall 10. For illustration, some micro holes may be filled with a non-translucent insulating material 14 to prevent passage of light. Thereby, graphical markings characteristic of the respective key may be displayed on the surface of the metal housing by actuation of a light source. In embodiments, the micro holes which allow light to pass therethrough may be arranged so as to define the shape of a desired graphical marking, such as an arrow, a square, a numerical digit, or similar.

For keys including micro holes with conductive material extending therein and which are translucent, the micro holes may be used to both electrically sense contact with a user's skin and to make the key visible, if desired. While not illustrated in the inset of FIG. 1, the key may additionally or alternatively comprise dedicated illumination micro holes for passing light to the exterior of the housing. Such micro holes do not need to have a conductive material disposed therein.

Figure 2:
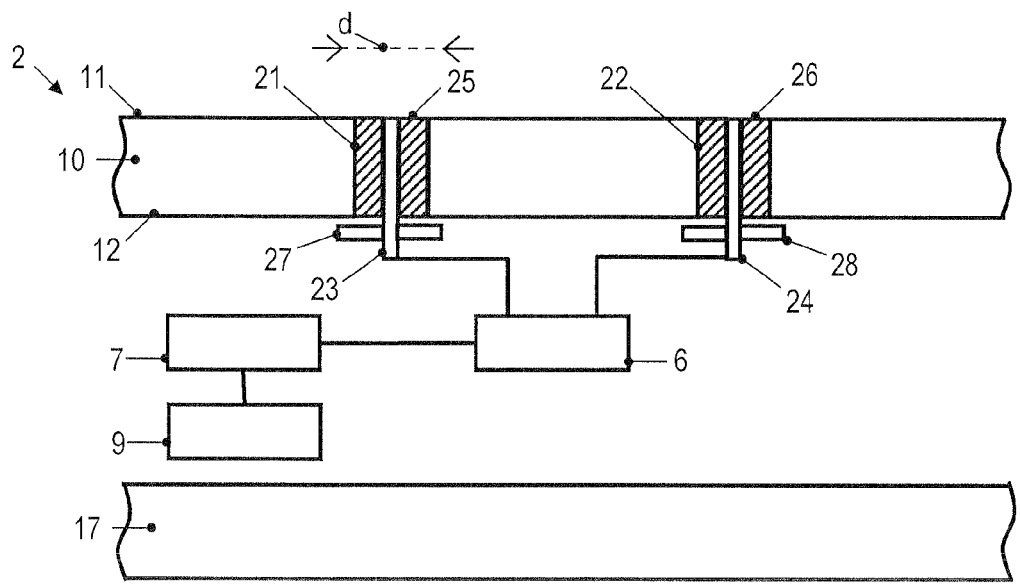
FIG. 2 is a schematic cross-sectional view of a portion of the housing taken along line II-II in FIG. 1.

FIG. 2 shows a schematic partial cross sectional view through a portable electronic device which includes a hidden key. The cross sectional view is taken along a line passing through micro holes which form a hidden key, such as along line II-II in FIG. 1. Elements or features which correspond, with regard to their construction or function, to elements or features shown in FIG. 1 are designated with the same reference signs.

The housing 2 of the portable electronic device may be formed from metal. The housing 2 includes a wall 10 and an opposite wall 17. The wall 10 has an outer face 11 which is visible from the outside of the device and an inner face 12.

In the wall 10, a hidden key is formed. The hidden key includes a plurality of micro holes which extend therein form the inner face 12 to the outer face 11. The micro holes may be laser-drilled micro holes. Two micro holes 21, 22 are shown for illustration. A greater number of micro holes may be formed in an array which defines the key area. The micro holes 21, 22 may be formed to have a cylindrical inner boundary, which may have, for example, a circular or elliptical cross section.

In the micro hole 21, a conductive material 23 is arranged which extends from the inner face 12 up to the outer face 11 of the wall 10. An end of the conductive material 23 is flush with the outer face 11. An insulating material 25 is interposed between the conductive material 23 and the inner boundary of the micro hole 21. The further micro hole 22 has a similar configuration, with a conductive material 24 and an insulating layer 26 being provided in the further micro hole 22. The micro holes 21 and 22 may respectively be configured such that, at the outer face 11, a maximum diameter d of the micro holes 21 and 22 may be smaller than, for example, 0.2 mm or smaller than 0.1 mm. The micro holes 21 and 22 may be formed by laser drilling.

In the illustrated configuration, the insulating material 25 may be translucent and a controllable light source 27 may be arranged in the interior of the housing to couple light into the insulating material 25. Similarly, the insulating material 26 in the further micro hole 22 may be translucent and a controllable light source 28 may be arranged in the interior of the housing to couple light into the insulating material 26. The light sources 27 and 28 are coupled to a controller 9 which selectively activates the light sources 27 and/or 28 when the key is to be visible. The controller 9 may be coupled to the processor 7 of the portable electronic device and may selectively activate the light sources 27 and 28 depending on an operation state of the electronic device.

The conductive material 23 extending through the micro hole 21 and the conductive material 24 extending through the further micro hole 22 are coupled to the sensor 6. Various configurations may be utilized to detect contact of a user's skin with the outer face 11 in the area in which the micro holes 21, 22 are formed.

In one implementation, the sensor 6 may be a capacitance sensor. The conductive material 23, 24 disposed in various micro holes defining a key may all be electrically connected to one terminal of the sensor 6. By virtue of such a configuration, the resultant change in capacitance observed by the sensor 6 may be enhanced when the user's skin simultaneously contacts the conductive material arranged in various micro holes of the key.

In another implementation, the sensor 6 may be a resistance sensor. The drop in resistance from infinity to a finite value when a user's skin establishes a conduction path between a conductive material and a reference electrode may be observed using various configurations. For illustration, the conductive materials arranged in a first sub-set of the micro holes may all be electrically connected to a first terminal (e.g., cathode terminal for a resistance measurement) of the sensor and the conductive materials arranged in a second sub-set of the micro holes may all be electrically connected to a second terminal (e.g., anode terminal for a resistance measurement) of the sensor 6. Thereby, the resistance between conductive materials arranged in different ones of the micro holes can be measured, which decreases when a user's skin establishes a conduction path between the conductive materials arranged in different micro holes. In another implementation, when the housing 2 is formed from a metal, the sensor 6 may monitor a current flow between the housing 2 and the conductive materials arranged in the micro holes. The housing may be electrically connected to a first terminal (e.g., cathode terminal for a resistance measurement) of the sensor 6 and the conductive materials arranged in the micro holes may all be electrically connected to a second terminal (e.g., anode terminal for a resistance measurement) of the sensor 6. Thereby, the resistance between conductive materials arranged in the micro holes and the housing 2 can be measured, which decreases when a user's skin establishes a conduction path between the conductive materials and the housing 2.

Other techniques may be utilized to sense whether a user's skin contacts the outer face 11 of the housing in a key area. Further, as can be taken from the foregoing, in order to sense actuation of one key formed with micro holes, electrical connections may be made such that only one or two terminals at the sensor 6 are required for sensing a drop in resistance or a change in capacitance. For a portable electronic device having a plurality of hidden keys formed with micro holes, the plurality of keys may be electrically connected to one sensor 6. The one sensor may be configured to identify the actuated key using known techniques, such as identifying row and column conductive traces between which a resistance drop has occurred.

Figure 3:
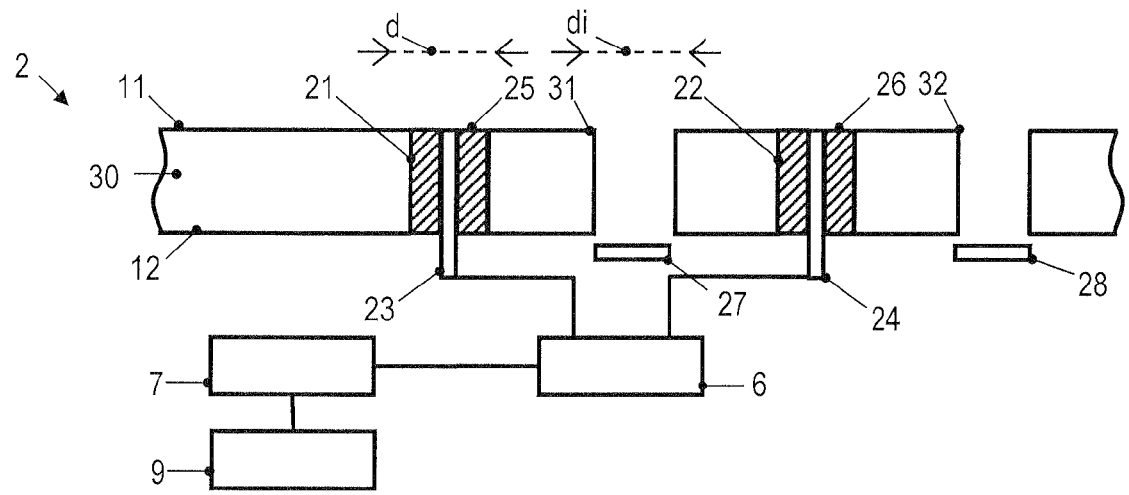
FIG. 3 is a cross-sectional view showing a housing wall of a portable electronic apparatus according to an embodiment.

FIG. 3 shows a schematic partial cross sectional view through a portable electronic device which includes a hidden key. The cross sectional view is taken along a line passing through micro holes which form a hidden key, such as along line II-II in FIG. 1. Elements or features which correspond, with regard to their construction or function, to elements or features shown in FIG. 1 or FIG. 2 are designated with the same reference signs.

A housing 2 of the electronic device includes a wall 30 having micro holes 21, 22 formed therein, as explained with reference to FIG. 2. The micro holes 21, 22 may be laser-drilled holes. Sensing contact of a user's skin with the outer face 11 in the area in which the micro holes 21, 22 are formed may be performed as described with reference to FIGS. 1 and 2. However, the insulating layer 25, 26 disposed with in the micro holes 21 and 22 does not need to be translucent. Separate illumination micro holes 31, 32 are formed in the wall 30 so as to extend from an inner face 12 to an outer face 11 of the wall 30. The illumination micro holes 31 and 32 may respectively be laser-drilled holes. The illumination micro holes 31 and 32 have a maximum diameter di which may be comparable to, or smaller than, the resolution limit of the unaided human eye, thereby rendering the key a hidden key. In an embodiment, the illumination micro holes may have a maximum diameter of less than 0.2 mm, in particular of less than 0.1 mm.

A light source 27 associated with the illumination micro hole 31 and a light source 28 associated with the illumination micro hole 32 are provided. The light sources 27, 28 may be activated to make the associated key visible, under the control of a controller 9. Activation of the light sources 27, 28 may be performed as described with reference to FIG. 2. Activation of the light sources 27, 28 may be performed selectively as a function of an operation state of the device. The illumination micro holes may optionally be filled with a translucent material.

Figure 4:
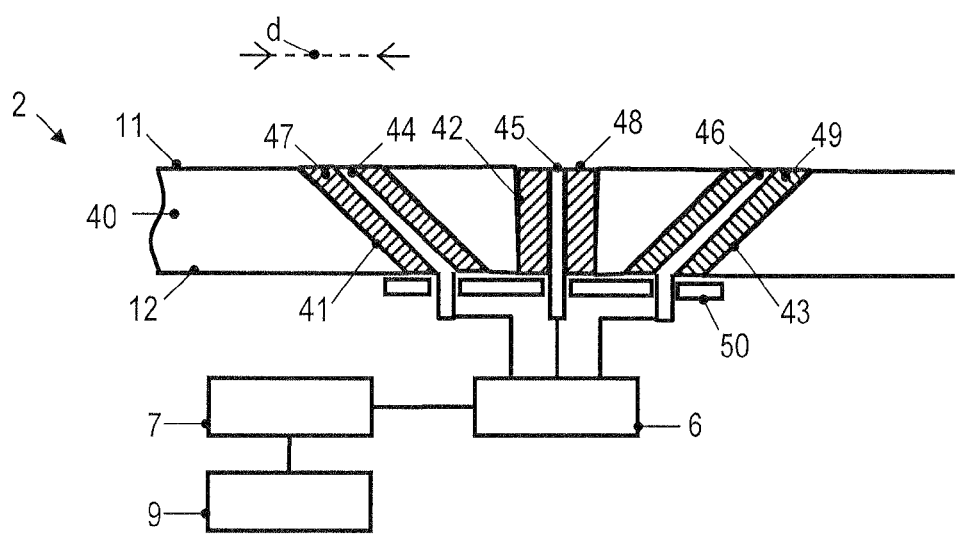
FIG. 4 is a cross-sectional view showing a housing wall of a portable electronic apparatus according to another embodiment.

FIG. 4 shows a schematic partial cross sectional view through a portable electronic device which includes a hidden key. The cross sectional view is taken along a line passing through micro holes which form a hidden key, such as along line II-II in FIG. 1. Elements or features which correspond, with regard to their construction or function, to elements or features shown in one of FIGS. 1-3 are designated with the same reference signs.

A housing 2 of the electronic device includes a wall 40 having micro holes 41-43 formed therein. The micro holes 41-43 may be formed by laser drilling or using another technique which allows the micro holes 41-43 to be formed with a small diameter. Conductive materials 44-46 are disposed within the micro holes. The conductive materials 44-46 extend through the wall 40 from the inner face 12 to the outer face 11. In the illustrated embodiment, ends of the conductive materials 44-46 are exposed on the outer face 11 and are flush with the outer face 11.

The micro holes 41-43 have longitudinal axes disposed at an angle relative to each other. While the longitudinal axis of the micro hole 42 is directed perpendicularly to the plane defined by the outer face 11, the longitudinal axes of the micro holes 41 and 43 intersect the outer face 11 at an angle different from 90°. The longitudinal axes of the micro holes 41 and 42 enclose an angle which is greater than 0°. Similarly, the longitudinal axes of the micro holes 41 and 42 enclose an angle which is greater than 0°.

A configuration as shown in FIG. 4, in which the longitudinal axes of the micro holes forming a key do not all extend in parallel, may be used to simplify the arrangement required for electrically contacting the conductive elements in the micro holes 41-43 and/or for coupling light into the micro holes. For illustration, a distance between the centers of the openings defined by the micro hole 41 and by the micro hole 42 in the outer face 11 of the housing wall 40 may be greater than a distance between the centers of the openings defined by the micro hole 41 and by the micro hole 42 in the inner face 12 of the housing wall 40. Similarly, a distance between the centers of the openings defined by the micro hole 41 and by the micro hole 43 in the outer face 11 of the housing wall 40 may be greater than a distance between the center of the openings defined by the micro hole 41 and by the micro hole 43 in the inner face 12 of the housing wall 40. A light source 50 arranged in the interior of the housing may then be associated with plural micro holes 41-43 to couple light into the micro holes. Similarly, the conductive material arranged in the micro holes 41-43 may be electrically contacted, within the housing, in a contact area on the inner face 12 which is smaller than the area of the key on the outer face 11.

Sensing contact of a user's skin with the outer face 11 in the area in which the micro holes 41-43 are formed may be performed as described with reference to FIGS. 1 and 2. Activation of the light source 50 may be performed as described with reference to FIG. 2.

As explained with reference to FIG. 4, arranging the micro holes such that the pattern of micro openings on the outer face 11 is different from the pattern of micro openings on the inner face 12 may be advantageous for implementing the required electrical connections and for illumination. This concept will be further illustrated with reference to FIGS. 5 and 6.

Figure 5:
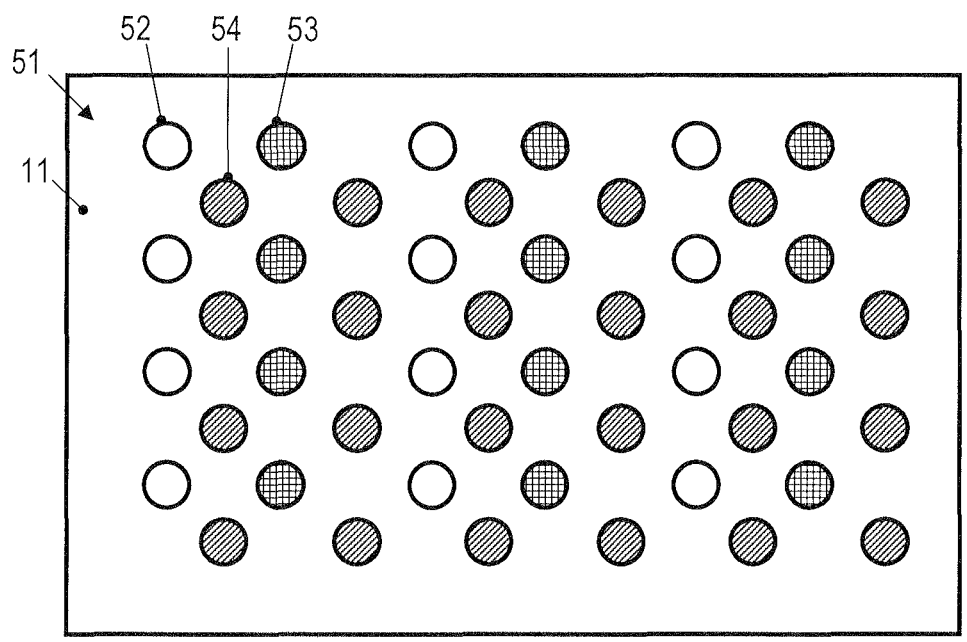
FIG. 5 is a schematic plan view of an outer face of a housing wall of a device according to an embodiment.

FIG. 5 is a schematic plan view of an outer face 11 of a housing wall. The area defining one key includes a plurality of micro holes in a regular arrangement 51. For illustration rather than limitation, an arrangement 51 having a plurality of first micro holes 52 (shown as open circles), a plurality of second micro holes 53 (shown with square hatching) and a plurality of third micro holes 54 (shown with line hatching) is illustrated. The first micro holes 52 may have arranged therein conductive material coupled to a first terminal (e.g., anode) of a resistance sensor. The second micro holes 53 may have arranged therein conductive material coupled to a second terminal (e.g., cathode) of a resistance sensor. The third micro holes 54 may be illumination micro holes which do not have conductive material disposed therein. The first, second and third micro holes are arranged such that they pass through the outer face in an alternating pattern.

Figure 6:
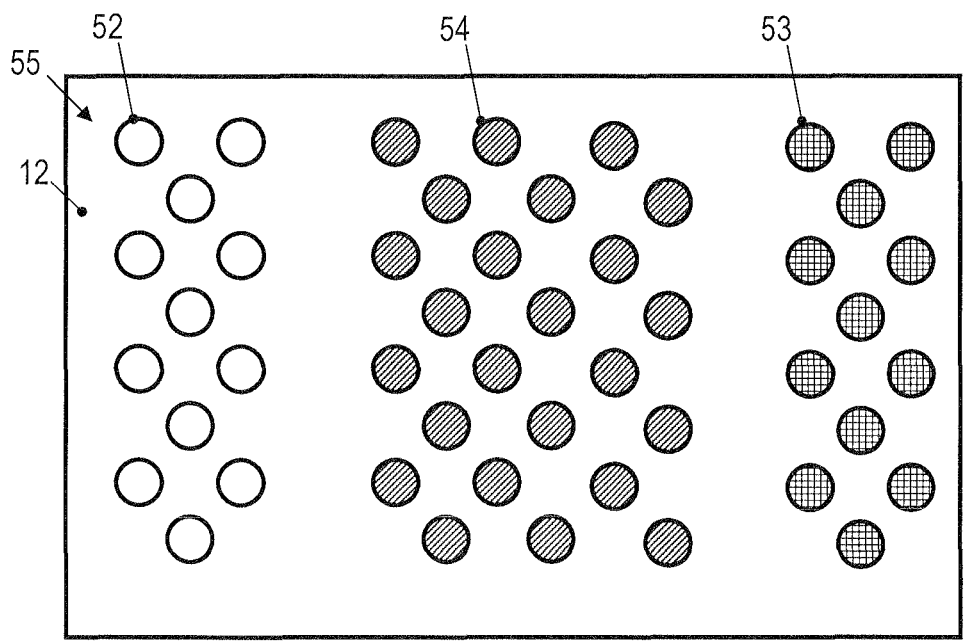
FIG. 6 is a schematic plan view of an inner face of the housing wall of FIG. 5.

FIG. 6 is a schematic plan view of an inner face 12 of the housing wall of FIG. 5, in which the arrangement of first, second and third micro holes are formed. The first, second and third micro holes 52-54 pass through the wall such that they intersect the inner face 12 in a pattern which is different from the pattern at the outer face 11. More specifically, the first micro holes 52 pass through the inner face 12 such that the corresponding openings are arranged in a first region. The second micro holes 53 pass through the inner face 12 such that the corresponding openings are arranged in a second region separate and spaced from the first region. The third micro holes 54 pass through the inner face 12 such that the corresponding openings are arranged in a third region, which is separate and spaced from the first and second regions. It will be appreciated that simple extended contact pads may be utilized to electrically contact the conductive material arranged in the first micro holes 52 on the inner face, or to electrically contact the conductive material arranged in the second micro holes 53 on the inner face. Similarly, one light source may be sufficient to couple light into the plurality of third holes 53.

In any one of the embodiments described herein, the conductive material disposed in a first micro hole associated with a key and the conductive material disposed in a second micro hole associated with the same key may be electrically coupled to the same terminal of the sensor. In particular, a conductive pad or layer may be arranged on the inner face of the housing so as to contact the conductive material provided in several micro holes which are associated with the same key. The conductive pad or layer may be integrally formed with the conductive material arranged in plural micro holes associated with the same key. The conductive pad or layer may be electrically coupled to a terminal of the sensor. An embodiment having such a construction will be explained in more detail with reference to FIG. 7.

Figure 7:
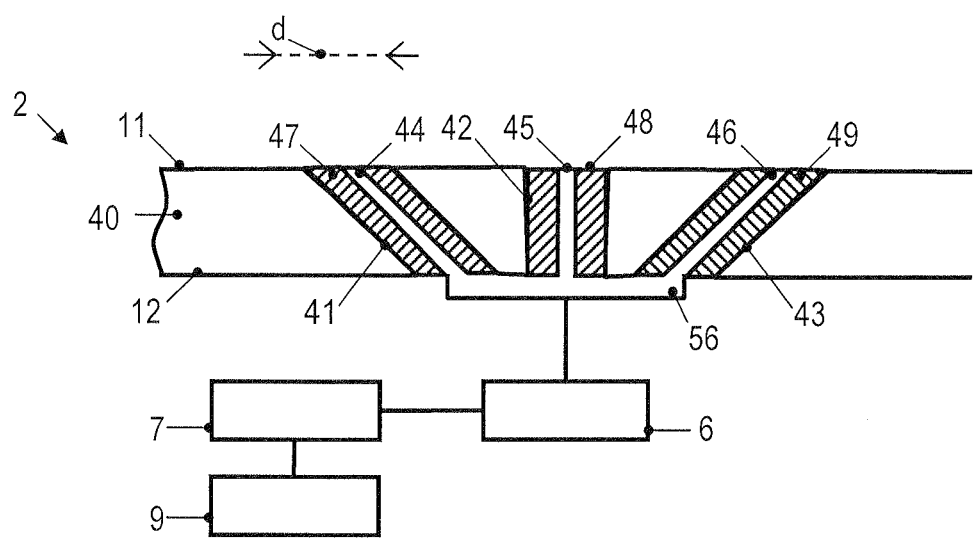
FIG. 7 is a cross-sectional view showing a housing wall of a portable electronic apparatus according to another embodiment.

FIG. 7 shows a schematic partial cross sectional view through a portable electronic device which includes a hidden key. The cross sectional view is taken along a line passing through micro holes which form a hidden key, such as along line II-II in FIG. 1. The construction of the hidden key is essentially based on the configuration explained with reference to FIG. 4. Elements or features which correspond, with regard to their construction or function, to elements or features shown FIG. 4 are designated with the same reference signs.

A housing 2 of the electronic device of FIG. 7 includes a wall 40 having micro holes 41-43 formed therein. A conductive material 44-46 is respectively disposed within the micro holes 41-44. The conductive material 44-46 extends through the wall 40 from the inner face 12 to the outer face 11. In the illustrated embodiment, ends of the conductive material 44-46 are exposed on the outer face 11 and are flush with the outer face 11.

On the inner face 12, a conductive pad 56 is provided which is electrically connected to the conductive material 44-46 arranged in at least two micro holes 41-43. The conductive pad 56 is electrically coupled to the sensor 6. As has been explained above, by using an arrangement in which the conductive material arranged in plural micro holes is connected to the same terminal of the sensor 6, detection efficiency may be enhanced when a user's skin contacts plural micro holes associated with one key. The sensor 6 may be a resistance or capacitance sensor.

While FIG. 7 illustrates an embodiment having micro holes with longitudinal axes arranged at angles relative to each other, the provision of a conductive layer or pad on the inner face 12 of the housing 2 may be implemented with other configurations of micro holes, for example in configurations in which the micro holes extend parallel to each other as shown in FIGS. 2 and 3 or when the micro holes have longitudinal axes which are not linear.

It will be appreciated that various modifications may be made to the devices explained with reference to FIGS. 1-7.

For illustration, while devices have been explained in which an insulating layer is deposited in the interior of the micro hole, other techniques may be utilized to electrically insulate a conductive material disposed in the micro hole from a metal housing. For illustration, a boundary of micro holes formed in a metal housing may be oxidized to form an insulating metal oxide layer. It is then no longer required to deposit an insulating material layer in the micro hole.

Figure 8:
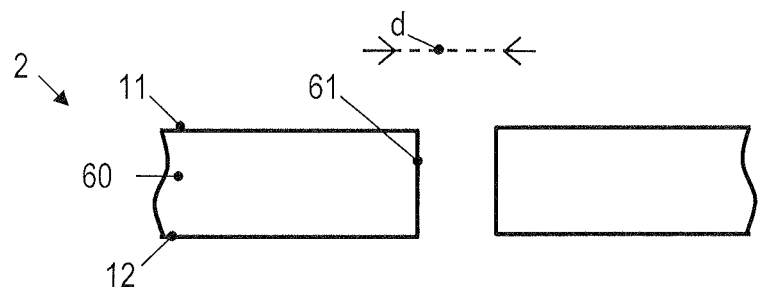
FIGS. 8-10 are schematic views illustrating a method of producing an electronic device according to an embodiment.
Figure 9:
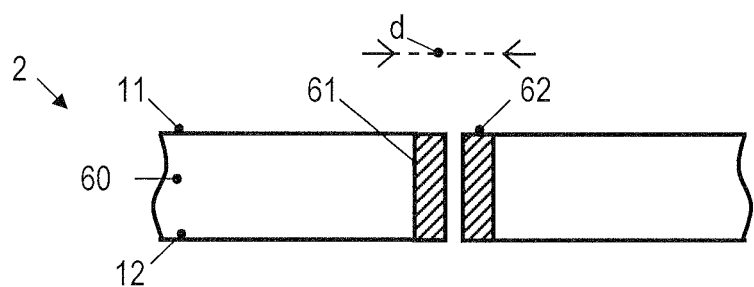
Figure 10:
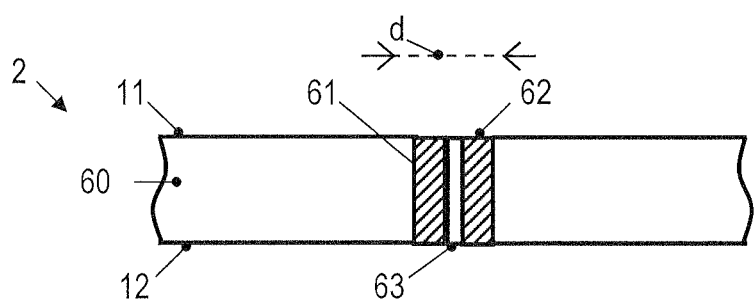

With reference to FIGS. 8-10, a method of manufacturing an electronic device according to an embodiment will be described. The device is manufactured to have a hidden key on a housing wall 60. The housing may be formed from a metal. While the method will be explained with reference to one micro hole, the method may be applied to form a plurality of micro holes, to fill them with insulating material and to arrange a conductive material therein. The method may be utilized to manufacture any one of the electronic devices described herein.

As illustrated in FIG. 8, a micro hole 61 is formed in the housing wall 60. The micro hole 61 may be formed by laser drilling. The micro hole may be arranged such that its longitudinal axis is perpendicular to an outer face 11 of the wall 60. However, at least one of the micro holes forming the hidden key may be formed such that its longitudinal axis encloses an angle of greater than 0° with the normal direction of the outer face 11. The micro hole 61 may be formed such that it defines an opening in the outer face 11 which has a maximum diameter d comparable to or smaller than the resolution limit of the unaided human eye. In an implementation, the micro hole 61 may be formed such that it has a maximum diameter d of less than 0.2 mm, and in particular of less than 0.1 mm.

As illustrated in FIG. 9, an insulating material 62 is deposited within the micro hole 61. The insulating material 62 may be deposited at least as a layer on the metal/hole interface. In an embodiment, the insulating material is deposited such that it does not fill the micro hole 61 completely.

As illustrated in FIG. 10, the micro hole 61 is filled, at least partially, with a conductive material 63. The conductive material 63 extends up to the outer face 11. An end of the conductive material 63 may be flush with the outer face 11 or may slightly protrude from the outer face 11.

A conductive layer or pad may be formed on the inner face 12 of the housing. The conductive layer or pad may be electrically connected to the conductive material disposed in several micro holes which are associated with one key. The conductive layer or pad may be integrally formed with the conductive material disposed in plural micro holes.

Using the method described with reference to FIGS. 8-10, electrical connections protruding through the housing wall 60 may be formed. The electrical connections are electrically insulated from the metal housing. The electrical connections may then be electrically coupled to a sensor which senses a change in electrical characteristic, such as a resistance or capacitance sensor.

Figure 11:
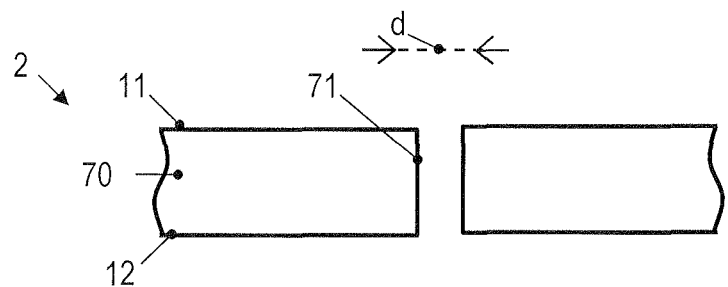
FIGS. 11-13 are schematic views illustrating a method of producing an electronic device according to an embodiment.
Figure 12:
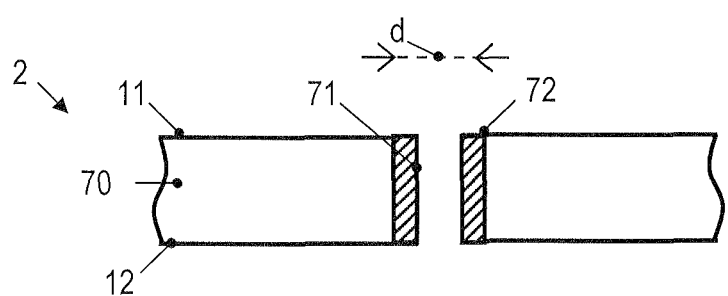
Figure 13:
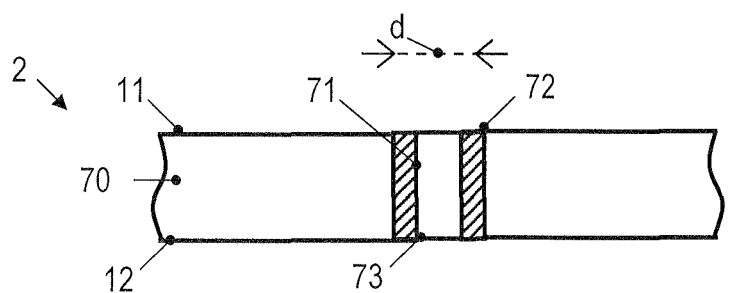

With reference to FIGS. 11-13, a method of manufacturing an electronic device according to an embodiment will be described. The device is manufactured to have a hidden key on a housing wall 70. The housing is formed from a metal. While the method will be explained with reference to one micro hole, the method may be applied to form a plurality of micro holes, to fill them with insulating material and to arrange a conductive material therein. The method may be utilized to manufacture any one of the electronic devices described herein.

In the method of FIGS. 11-13, the metal forming the housing is selected such that metal native oxide has suitable properties to serve as an insulating layer.

As illustrated in FIG. 11, a micro hole 71 is formed in the housing wall 70. The micro hole 71 may be formed by laser drilling. The micro hole may be arranged such that its longitudinal axis is perpendicular to an outer face 11 of the wall 70. However, at least one of the micro holes forming the hidden key may be formed such that its longitudinal axis encloses an angle of greater than 0° with the normal direction of the outer face 11. The micro hole 71 may be formed such that it defines an opening in the outer face 11 which has a maximum diameter d comparable to or smaller than the resolution limit of the unaided human eye. In an implementation, the micro hole 71 may be formed such that it has a maximum diameter d of less than 0.2 mm and in particular of less than 0.1 mm.

As illustrated in FIG. 12, the metal is oxidized at a boundary of the micro hole 71. An insulating layer 72 of metal oxide is thereby formed.

As illustrated in FIG. 13, the micro hole 71 is filled, at least partially, with a conductive material 73. The conductive material 73 extends up to the outer face 11. An end of the conductive material 73 may be flush with the outer face 11 or may slightly protrude from the outer face 11.

A conductive layer or pad may be formed on the inner face 12 of the housing. The conductive layer or pad may be electrically connected to the conductive material disposed in several micro holes which are associated with one key. The conductive layer or pad may be integrally formed with the conductive material disposed in plural micro holes.

Using the method described with reference to FIGS. 11-13, electrical connections protruding through the housing wall 70 may be formed. The electrical connections are electrically insulated from the metal housing. The electrical connections may then be electrically coupled to a sensor which senses a change in electrical characteristic, such as a resistance or capacitance sensor.

While electronic devices and method of manufacturing electronic devices according to various embodiments have been described, various modifications may be implemented in further embodiments. For illustration rather than limitation, while micro holes having an essentially circular cross section have been illustrated in the context in some of the drawings, other shapes may also be employed. While, in some embodiments, the micro holes defining the hidden key are cylindrical, other geometries may be used, such as micro holes which taper towards the outer face. While the devices of some embodiments have been described to include a light source internally of the housing for selectively making a hidden key visible, the provision of such light sources is optional. Alternative methods of indicating the location of a key may also be employed, including simple methods such as permanent graphical markings provided on the outer face of the housing. For further illustration, while embodiments have been described in which a hidden key includes a plurality of micro holes, it is also conceivable to reduce the number of micro holes, even down to one micro hole having a conductive material arranged therein. Further, hidden keys may be combined with conventional keys having mechanically moveable elements or with capacitive keys sensing depression of the housing in a certain area. In particular, the electronic device according to embodiments may include some keys formed with micro holes and other keys formed using different techniques. In embodiments, at least one side of the electronic device may be formed to have only keys formed with micro holes thereon. A mechanical key may optionally be provided at another side of the device.

It is to be understood that the features of the various embodiments may be combined with each other. For illustration rather than limitation, micro holes which are configured such that the longitudinal axes of at least two micro holes are disposed at an angle relative to each other, as described with reference to FIG. 4, may also be used in configurations having separate illumination micro holes, as explained with reference to FIG. 3.

Examples for devices which may be equipped with a key comprising micro holes, as described herein, include, but are not limited to, a mobile phone, a cordless phone, a personal digital assistant (PDA), a portable music player, a camera and the like.

The invention claimed is:

1. An electronic device, said electronic device comprising
a housing having an outer face and an inner face;
a key provided on said housing, said key comprising:
    a micro hole formed in said housing so as to extend from said inner face to said outer face and having a diameter smaller than said key,
    a conductive material extending within said micro hole to said outer face of said housing, and
    at least one further micro hole formed in said housing so as to extend from said inner face to said outer face;
    said micro hole and said at least one further micro hole being formed such that a distance between centers of openings defined by said micro hole and said at least one further micro hole at said outer face is greater than a distance between centers of openings defined by said micro hole and said at least one further micro hole at said inner face; and
a sensor coupled to said conductive material, said sensor being configured to monitor an electrical characteristic to detect whether an object is brought into contact or out of contact with said conductive material of said micro hole at said outer face of said housing.

2. The electronic device of claim 1,
said conductive material being exposed on said outer face of said housing.

3. The electronic device of claim 1, said micro hole extending from said inner face to said outer face through a wall of said housing, said wall defining a normal direction perpendicular to said wall, said micro hole having a centre axis disposed at an angle which is greater than 0° relative to said normal direction.

4. The electronic device of claim 1,
said housing being formed from a metal material.

5. The electronic device of claim 4,
said sensor being electrically coupled to said housing.

6. The electronic device of claim 4,
said metal material being oxidized at a boundary of said micro hole to form an insulating metal oxide layer interfacing with said conductive material.

7. The electronic device of claim 1,
said key further comprising an insulating layer interposed between said conductive material and a boundary of said micro hole to electrically insulate said conductive material from said housing.

8. The electronic device of claim 7,
said insulating layer being translucent,
said electronic device further comprising a light source disposed within said housing and configured to couple light into said insulating layer.

9. The electronic device of claim 1,
an end of said conductive material being flush with or protruding from said outer face of said housing.

10. The electronic device of claim 1,
a further conductive material respectively extending to said outer face within said further micro holes, said further conductive material being respectively coupled to said sensor.

11. The electronic device of claim 1,
said key further comprising a plurality of illumination micro holes extending from said inner face to said outer face through said housing,
said electronic device further comprising a light source disposed within said housing and configured to couple light into said plurality of illumination micro holes.

12. The electronic device of claim 1, said sensor being a resistance sensor.

13. The electronic device of claim 1, said sensor being a capacitance sensor.

14. The electronic device of claim 1, said electronic device being a portable electronic device.

15. An electronic device, said electronic device comprising a housing having an outer face and an inner face;
a key provided on said housing, said key comprising:
  a first plurality of micro holes formed in said housing so as to extend from said inner face to said outer face, each micro hole of said first plurality of micro holes having a diameter much smaller than said key and having arranged therein conductive material,
  a second plurality of micro holes formed in said housing so as to extend from said inner face to said outer face, each micro hole of said second plurality of micro holes having a diameter much smaller than said key and having arranged therein conductive material,
  a third plurality of micro holes formed in said housing so as to extend from said inner face to said outer face and each having a diameter much smaller than said key; and
a sensor configured to monitor an electrical characteristic to detect whether an object is brought into contact or out of contact with said outer face of said housing, said sensor comprising:
  a first terminal connected to the conductive material of the first plurality of micro holes; and
  a second terminal connected to the conductive material of the first plurality of micro holes.

* * * * *